(12) United States Patent
Torrisi et al.

(10) Patent No.: US 7,606,078 B2
(45) Date of Patent: Oct. 20, 2009

(54) METHOD FOR PROGRAMMING OF MEMORY CELLS, IN PARTICULAR OF THE FLASH TYPE, AND CORRESPONDING PROGRAMMING ARCHITECTURE

(76) Inventors: Davide Torrisi, Via Lombardia, 59, I-95024 - Acireale (CT) (IT); Edoardo Nocita, Via Perugia, 10, I-95129 - Catania (IT); Alessandro Tumminia, Via Nebrodi, 30, I-95123- Catania (IT)

( * ) Notice: Subject to any disclaimer, the term of this patent is extended or adjusted under 35 U.S.C. 154(b) by 160 days.

(21) Appl. No.: 11/636,382

(22) Filed: Dec. 8, 2006

(65) Prior Publication Data
US 2007/0147130 A1    Jun. 28, 2007

(30) Foreign Application Priority Data
Dec. 9, 2005    (IT)    ............................ MI2005A2350

(51) Int. Cl.
    *G11C 16/06*    (2006.01)
(52) U.S. Cl. ............................. 365/185.22; 365/185.18
(58) Field of Classification Search ............. 365/185.14, 365/185.28
See application file for complete search history.

(56) References Cited

U.S. PATENT DOCUMENTS

| | | | | |
|---|---|---|---|---|
| 6,885,584 B2* | 4/2005 | Schillaci et al. | ........ | 365/185.12 |
| 7,286,406 B2* | 10/2007 | Lutze et al. | ............ | 365/185.18 |
| 7,366,022 B2* | 4/2008 | Li et al. | ................. | 365/185.22 |
| 2002/0041516 A1* | 4/2002 | Tran et al. | ............. | 365/185.03 |
| 2004/0145947 A1* | 7/2004 | Micheloni et al. | ...... | 365/185.19 |
| 2005/0157555 A1* | 7/2005 | Ono et al. | .............. | 365/185.18 |

\* cited by examiner

*Primary Examiner*—Hoai V Ho
*Assistant Examiner*—Anthan T Tran
(74) *Attorney, Agent, or Firm*—Trop, Pruner & Hu, P.C.

(57) ABSTRACT

A method is described for programming memory cells, in particular of the Flash type. In accordance with the method, a verification is performed with a first parallelism (M) in which a reading is carried out for determining the state of a group of memory cells, a determination is performed of a programming parallelism (np), based on the results of the verification, and a real programming of the memory cells carried out with the programming parallelism (np). An architecture is also described for programming memory cells in particular of the Flash type.

7 Claims, 5 Drawing Sheets

METHOD FOR PROGRAMMING OF MEMORY CELLS, IN PARTICULAR OF THE FLASH TYPE, AND CORRESPONDING PROGRAMMING ARCHITECTURE

PRIORITY CLAIM

The present application claims priority from Italian Patent Application No. MI2005A 002350 filed Dec. 9, 2005, the disclosure of which is hereby incorporated by reference.

BACKGROUND OF THE INVENTION

1. Technical Field of the Invention

The present invention relates to a method for programming memory cells of the Flash type.

The invention also relates to an architecture for programming memory cells, in particular of the Flash type.

The invention particularly, but not exclusively, relates to a memory device of the Flash type suitable for being used in compact disk (CD) players, video cameras, cell phones, and the like, and the following description is made with reference to this field of application for simplifying its illustration only.

2. Description of Related Art

As it is well known, Flash memories are non volatile memories, able to maintain the information also in the absence of power supply and organized so as to be erasable by sector.

The information contained in a common Flash memory cell is of the binary type, a first high logic value or bit '1' corresponding to one erased state and a second low logic value or bit '0' identifying a programmed state.

The programming operation can be conducted with a parallelism of 16 bits (according to the so called word mode) or 64 bits (according to the so called page mode), while the erasing operation generally always relates to an entire sector of the memory, whose current density varies from 0.5 to 2 MBits. These operations are managed by a microcontroller embedded in the Flash memory device that executes suitable programming and erasing algorithms contained in a ROM memory, in turn included in the Flash memory device.

The erasing time (like the programming time) should meet a specification that, in current memories, is of about 0.7 sec and that, in the future, will tend to decrease due to the increase of the speed of the applications whereon the same will be employed, such as for example in the use inside CD players, video cameras and cell phones, etc.

FIG. 1 shows the typical current-voltage [I-V] characteristics of two memory cells of the Flash type, respectively in the erased state (bit 1)-curve A, and in the programmed state (bit 0)-curve B. As it can be noted in such figure, the I-V characteristics increase starting from a minimum voltage value, respectively VTHEV for an erased cell and VTHPV for a programmed cell.

It is also known that an erasing operation of a Flash memory comprises three distinct steps: a pre-programming step (or ALL0); a real erasing step (or ERASE); and a soft-programming step (or SOFTP).

The ALL0 step comprises the pre-programming of an entire sector of the Flash memory to be erased so that all the Flash cells of this sector are under the same initial conditions as regards their threshold voltage value. This pre-programming of the cells of the sector usually occurs with a parallelism of 16 bits (per word).

The ERASE step comprises the erasing of the entire sector and its resolution thus depends on the density of the sector itself. This resolution is substantially the minimum memory portion that can be erased, which has dimensions ranging from 0.5 Mbits to 2 Mbits in the considered applications.

The SOFT Programming step has the aim of recovering those cells whose threshold voltage, at the end of the ERASE step, is lower than a minimum voltage value of the distribution of the erased cells (indicated with VTHDV). This SOFT Programming step has a typical parallelism of 16 bits.

The distributions of the threshold voltages of the cells of a sector of a Flash memory subjected to an erasing operation—after each one of the above-indicated steps—are shown in FIG. 2, respectively indicated with DALL0, DERASE and DSOFTP. The area C of the distribution DSOFTP graphically shows the portion of Flash cells whose threshold voltage is lower than the minimum voltage value VTHDV and that should thus undergo soft-programming.

The continuous scaling of the technological processes, with the consequent reduction of the dimension of the single Flash cells, has implied an increase of the unhomogeneity between the cells of a sector, for example between a cell on board and a cell in the center, causing a higher and higher spread in the distribution of the threshold voltages of the erased bits as highlighted in FIG. 3, the arrow F indicating a technological scaling from 0.35 um to 0.09 um.

FIG. 3 highlights how this spread has a direct impact on the need of soft-programming a distribution, having passed from distributions which did not need any soft-programming (like the distribution D corresponding to the case of the technology with 0.35 um) to distributions which are to be almost totally soft-programmed (like the distribution E corresponding to the case of the most recent technology with 0.09 um).

For the distributions of the most recent technologies, moreover, the Flash cells whose threshold voltage is distant from the minimum value VTHDV being numerous, the same need soft-programming ramps with final voltage differences $\Delta V$ much higher than those of less recent technologies, reaching almost 5V in the case of the technologies with 0.09 um.

These two limitations make the soft-programming step, having much lower parallelism than that of the ERASE step, represent about 70% of the total erase time and thus it should be calibrated with care for respecting the specifications requested for a given Flash memory.

In particular, the erase time Terase is given by the sum of the times of the ALL0 ($T_{ALL0}$), ERASE ($T_{ERASE}$) and SOFT Programmig ($T_{SOFTP}$) steps:

$$Terase = \Sigma(T_{ALL0}, T_{ERASE}, T_{SOFTP})$$

As already hinted at, the duration $T_{ALL0}$ of the ALL0 step depends on the density of the sector of the Flash memory to be erased, on the duration of the programming and on the adopted parallelism, i.e. on the number of bits that will be simultaneously programmed (16 bits in the word mode, 64 bits in the page mode).

For example, considering a sector with density equal to 0.5 Mbit, a duration of the programming equal to 5 usec and a parallelism of 16 bits, the duration of the ALL0 step will be:

$$\begin{aligned} T_{ALL0} &= (\text{density}/\text{parallelism}) * \text{duration programming} \\ &= (500000/16) * 5 * 10e^{-6} \sim \\ &= 160 \text{ ms} \end{aligned}$$

The duration of the ERASE step instead depends on the duration of the erase pulse, on the overall voltage difference $\Delta V$ to be applied and on the value of the single step of voltage (step_voltage) and it is thus equal to:

$T_{ERASE}$=duration_erase_pulse*($\Delta V$/step_voltage)

Considering, for example, an erase pulse of duration 3 msec, an overall voltage difference $\Delta V$ of 5V and a value of the single step of voltage (step_voltage) of 125 mV it results:

$T_{ERASE}$=3*10$e^{-*}$(5/0.125)=120 msec

Finally, the duration of the SOFT Programming step depends, as in the case of the ALL0 step, on the density of the sector, on the duration of the programming, on the parallelism adopted and, finally, on the steps of voltage which allow to realize a programming ramp with a predetermined final voltage difference $\Delta V$.

For example, if also in this case a sector of density equal to 0.5 Mbit, a programming duration equal to 5 usec, a parallelism of 16 bits, a final voltage difference $\Delta V$ of 3V with steps of 375 mV are considered, the duration of the SOFTP step will be:

$$T_{SOFTP} = (\text{density}/\text{parallelism}) * \text{programming duration} *$$
$$(\Delta V / \text{step\_voltage})$$
$$= (500000/16) * 5 * 10 e^{-6} * (3/0.375)$$
$$= 1250 \text{ msec}$$

Therefore, the overall time of the erase step, in the above indicated hypotheses, will be equal to:

$T$erase=$\Sigma(T_{ALL0}, T_{ERASE}, T_{SOFTP})$~=160 msec+120 msec+1250 msec~=1.5 sec Time which, as it is easy to be verified, is widely out of the specifications of several applications.

Moreover, it is immediate to verify that the duration of the SOFT Programming step has a predominant impact on the total erase time, equal to about 70% as indicated above.

Also in the case in which the parallelism adopted were of 64 bits there would result:

$T_{ALL0}$=(500000/64)*5*10$e^{-6}$~=40 msec $T_{ERASE}$=120 msec (does not depend on the adopted parallelism)

$T_{SOFTP}$=(500000/64)*5*10$e$-6*(3/0.375)~=320 msec

The overall time of the erase step in this scenario would be thus equal to:

$T$erase=$\Sigma(T_{ALL0}, T_{ERASE}, T_{SOFTP})$~=40 msec+120 msec+320 msec~=500 msec It is thus evident that the reduction of the erase time is obtained by adopting a high parallelism and that therefore the reduction of the soft-programming time (which, as above said, represents 70% of the total erase time) is only a problem of parallelism.

The known erase methods thus provide, already in the design phase, a high parallelism of the soft-programming step. In this case, the soft-programming architecture associated with the Flash memory must necessarily comprise a charge pump designed for supplying the Flash cells with programming currents taking into consideration the "worst case", i.e., that in which the soft-programming step occurs with the maximum parallelism, the current to be supplied growing with the parallelism.

For example, if a Flash cell absorbs, during the soft-programming step, a current Icell, the charge pump will have to supply a current value Icharge_pump given by the following relation:

$I$charge_pump=$I$cell*parallelism

Taking then into consideration a value of this current Icell equal to about 100 uA, the current that the charge pump must supply depends on the parallelism and it is equal to:

parallelism 16 bits: $I$charge_pump=100 uA*16 bit=1.6 mA parallelism 32 bits: $I$charge_pump=100 uA*32 bit=3.2 mA parallelism 64 bits: $I$charge_pump=100 uA*64 bit=6.4 mA The most evident disadvantages of this approach result in a growing occupation in terms of silicon area by the charge pump when the chosen parallelism grows and a worse tracking on the process, since technologically more mature processes and thus Flash cells being less and less demanding in terms of current would no more justify the design choices aimed at increasing the maximum current which can be supplied by the charge pump.

If, in the example of parallelism 64 bits, the current Icell absorbed by the cell decreased from 100 uA to 60 uA it would be enough to have:

$I$charge_pump=60 uA*64 bit=3.8 mA

This value is considerably lower than 6.4 mA which was the design target for the charge pump of the soft-programming architecture based on the known method. This, therefore, is over-dimensioned with consequent waste of resources.

SUMMARY OF THE INVENTION

One embodiment of the present invention is directed to a method for programming memory cells. The method makes the parallelism of the programming step, in particular of soft-programming, adaptive so that it is a function of the current absorbed by the Flash cell during the programming itself, considering the maximum current which can be supplied by the charge pump fixed as per the design constant.

In an embodiment, the method comprises the following steps: a verify step with a first parallelism in which a reading is carried out for determining the state of a group of memory cells; a determination step of a programming parallelism, based on the results of the verify step; and a real programming step of the memory cells carried out with the programming parallelism.

A further embodiment of the invention is directed to a programming architecture of at least one array of memory cells, in particular of the Flash type, of the type comprising at least one microcontroller suitable for carrying out a programming operation of the cells by using at least one charge pump, at least one verify block connected to the array of memory cells and at least one programming block connected to the microcontroller, the verify block carrying out a verification of state of the array of memory cells with a first parallelism and the programming block generating a control flag for the regulation of a programming parallelism with which this microcontroller carries out the programming operation.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

The present invention starts from the consideration that, by maintaining the maximum current which can be supplied by the charge pump Icharge_pump constant, it is possible to realize an adaptive parallelism being only function of the Icell current absorbed by a Flash cell during a programming, according to the relation:

parallelism=$I_{charge\_pump}/I_{cell}$

The considerations made about the soft-programming step, in particular the impact of the soft-programming time on the erase time of a Flash memory, have allowed to identify, in the parallelism of this soft-programming step, one of the main problems of the methods proposed by the prior art. In reality, the proposed adaptive solution can be applied to a generic programming operation, and it is particularly useful in the case of a soft-programming of Flash memory cells.

Advantageously, thus, the present invention proposes a programming method comprising the following steps: a verify step according to a first parallelism M in which a reading is carried out for determining the state, in terms of threshold voltage, of a group of M memory cells, in particular of the Flash type (M bits, with M=16, 32, 64, . . . ); a determination step of a programming parallelism np, based on the results of this first verify step; and a real programming step carried out according to the programming parallelism np determined in the determination step.

In particular, the verify step determines a number (bit_to_pr) of memory cells, among those verified, which must undergo the programming step. Advantageously, this number bit_to_pr is then stored and used in the next step for determining the parallelism np of the last programming step.

In this way, advantageously according to an embodiment of the invention, where a maximum current Icharge_pump supplied by a charge pump of the programming architecture of the memory cells having been fixed, the programming step is carried out with a maximum parallelism until the number bit_to_pr is lower or equal to the driving capability of the pump itself, thus obtaining an adaptive programming.

Figure 4:
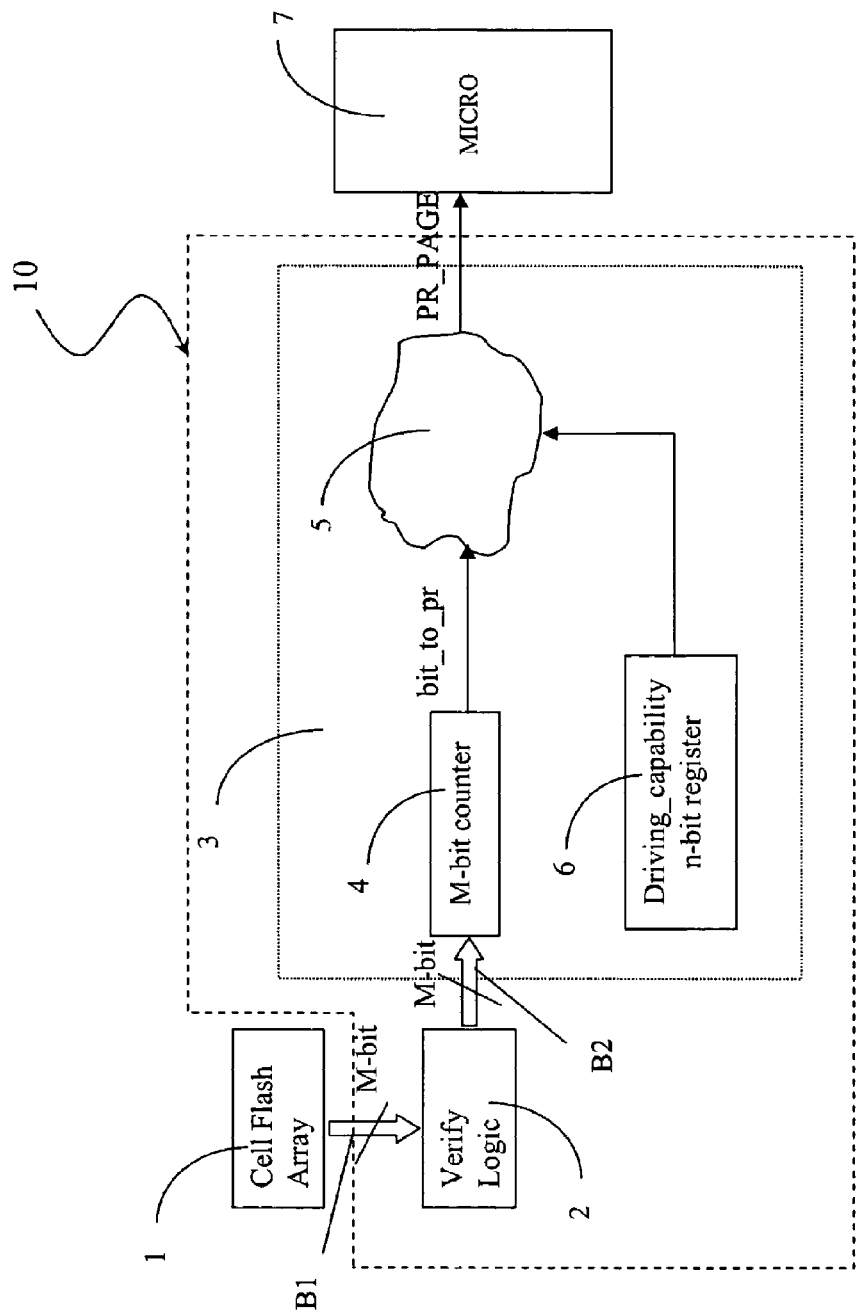
FIG. 4 schematically shows a programming architecture of memory cells realized according to the invention.

An architecture for programming of memory cells, in particular of the Flash type, realized according to the present invention is schematically shown in FIG. 4, globally indicated with 10.

The architecture 10 is connected, by means of a first input bus B1 with M bits, to an array 1 of Flash cells and comprises a verify block 2 and a programming block 3.

In particular, the verify block 2 is connected, by means of the first bus B1, to the array 1 of Flash cells and, by means of a second bus B2 with M bits, to the programming block 3.

Moreover, advantageously according to an embodiment of the invention, the programming block 3 comprises a counter 4 with M bits connected at the input, by means of the second bus B2, to the verify block 2 and at the output to a combinatorial portion 5. The counter 4 supplies the combinatorial portion 5 with the number bit_to_pr of memory cells needing to be programmed.

It is to be noted that the value M of the counter 4 is directly related to the maximum parallelism used during the verify operation, i.e. the reading operation of the state of the memory cells in terms of threshold voltage by the verify block 2, indicated hereafter as first parallelism M.

The programming block 3 also comprises a register 6 with n-bits indicative of the driving capability of the charge pump comprised into the Flash memory. The register 6 is a memory element whose dimension can be trimmed being a function of the design of the adopted charge pump and of the state of evolution of the technology with which the memory is realized and the value n, hereafter indicated also as second parallelism, is identified by the relation:

$n=I_{charge\_pump}/I_{cell}$

Obviously, according to the first parallelism M adopted in the verify operation and to the calculation formula of the second parallelism n, i.e. of the dimension of the register 6 above indicated, n can take a value comprised between:

$1<=n<=M$

Advantageously according to an embodiment of the invention, an attribution of a set of values is then provided for the second parallelism n. The adopted charge pump being identical, these values are a mirror of the technological evolution of the process, where technologically more mature processes will correspond to n higher values.

The combinatorial portion 5 receives at the input and compares the number of bits to be programmed, bit_to_pr, and the second parallelism n stored in the register 6, generating a control flag PR_PAGE.

In particular, this control flag PR_PAGE is placed at '1' in the case in which:

bit_to_pr<=n

In this case, a microcontroller 7 comprised in the Flash memory connected to the architecture 10 and connected at the output to the combinatorial portion 5 carries out the programming operation with a maximum programming parallelism np, i.e. equal to the first parallelism M (exactly because the driving capability of the pump is higher than the number of bits to be soft programmed): np=M.

In the contrary case, the control flag PR_PAGE is placed at '0' and the microcontroller 7 carries out the operation of soft programming with a minimum programming parallelism np (i.e. the second parallelism n ensured by the charge pump): np=n.

As it will be seen more clearly hereafter in the description, it is also possible to use a programming parallelism of the dichotomic type according to the condition:

if bit_to_pr>n→np=M/2 and so on for the successive comparisons.

Advantageously according to an embodiment of the invention, the architecture 10 thus allows to implement a method for programming memory cells of the adaptive type comprising the steps of: verify with a first parallelism M of the state of a group of cells contained in a Flash memory; determination of a number (bit_to_pr) of Flash cells among those verified which must undergo a programming operation; storage of a second parallelism n indicative of the driving capability of the charge pump comprised into the Flash memory according to the relation:

$$n = Icharge\_pump/Icell$$

wherein:
Icharge_pump the maximum current which can be supplied by the charge pump, and
Icell the current absorbed by a memory cell during a programming, comparison between the number of bits to be programmed, bit_to_pr, and the second parallelism n; generation of a control flag PR_PAGE; and execution of the real programming operation on the basis of the control flag PR_PAGE.

In particular, the programming method according to an embodiment of the invention provides that this generation step of the control flag PR_PAGE meets the following conditions:

$$PR\_PAGE = 1 \text{ if } bit\_to\_pr <= n$$

In this case, the programming operation is carried out with a programming parallelism np corresponding to the first parallelism M (maximum parallelism).

$$PR\_PAGE = 0 \text{ if } bit\_to\_pr > n$$

In this case, the programming operation is carried out with a programming parallelism np corresponding to the second parallelism n (minimum parallelism).

It is to be noted that the choice made according to an embodiment of the invention of realizing a programming method, in particular of soft-programming, of the adaptive type is based on important statistic considerations.

Figure 5:
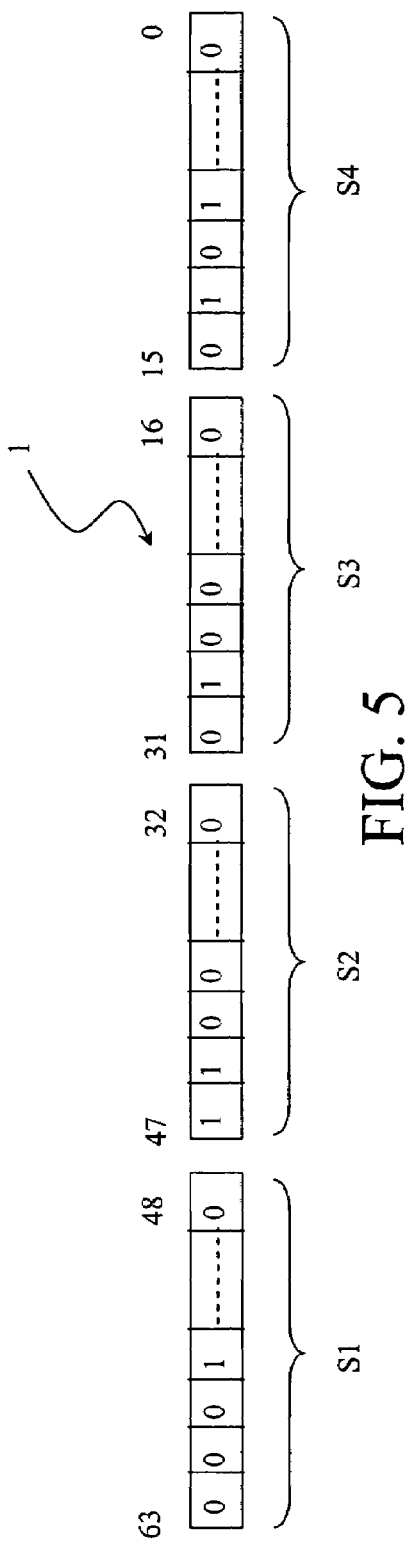
FIG. 5 shows a situation being statistically likely after an erasing step of the state of Flash cells to be soft-programmed with the method according to the present invention.

In particular, making reference to the architecture 10 shown in FIG. 4 and supposing a parallelism in verify equal to M=64 bits (verify per page, 4 words of 16 bit), a probably true condition for the state of the memory cells of the array 1 after an ERASE operation is shown in FIG. 5, where the array 1 has been suitably divided into four segments S1-S4.

In particular, each '0' represents a cell which does not need to be programmed, while the '1' refers to those cells whose threshold voltage is lower than the minimum value VTHDV and which thus are to be programmed.

Figure 6:
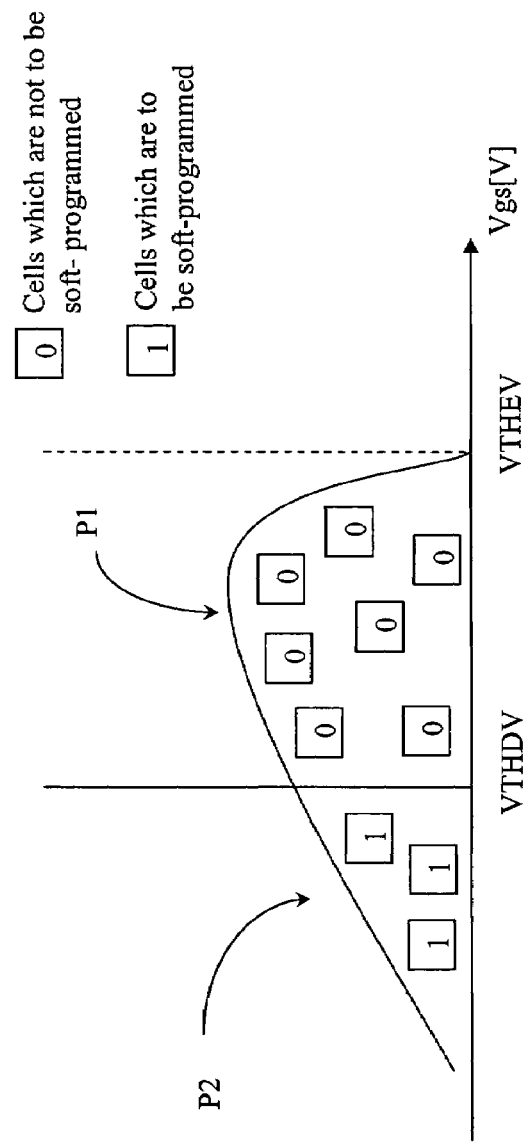
FIG. 6 shows the threshold voltage distribution of Flash cells to be soft-programmed with the method according to the present invention.

Similarly, making particular reference to a memory of the Flash type and to its erasing, FIG. 6 shows the distribution of the Flash cells of a same page, after a verify operation, according to the threshold voltage, the '0' representing cells which do not have to be soft-programmed and the '1' cells which are to be soft-programmed. In particular, a first portion P1 of cells to be soft-programmed and a second portion P2 of cells not to be soft-programmed are identified.

Figure 1:
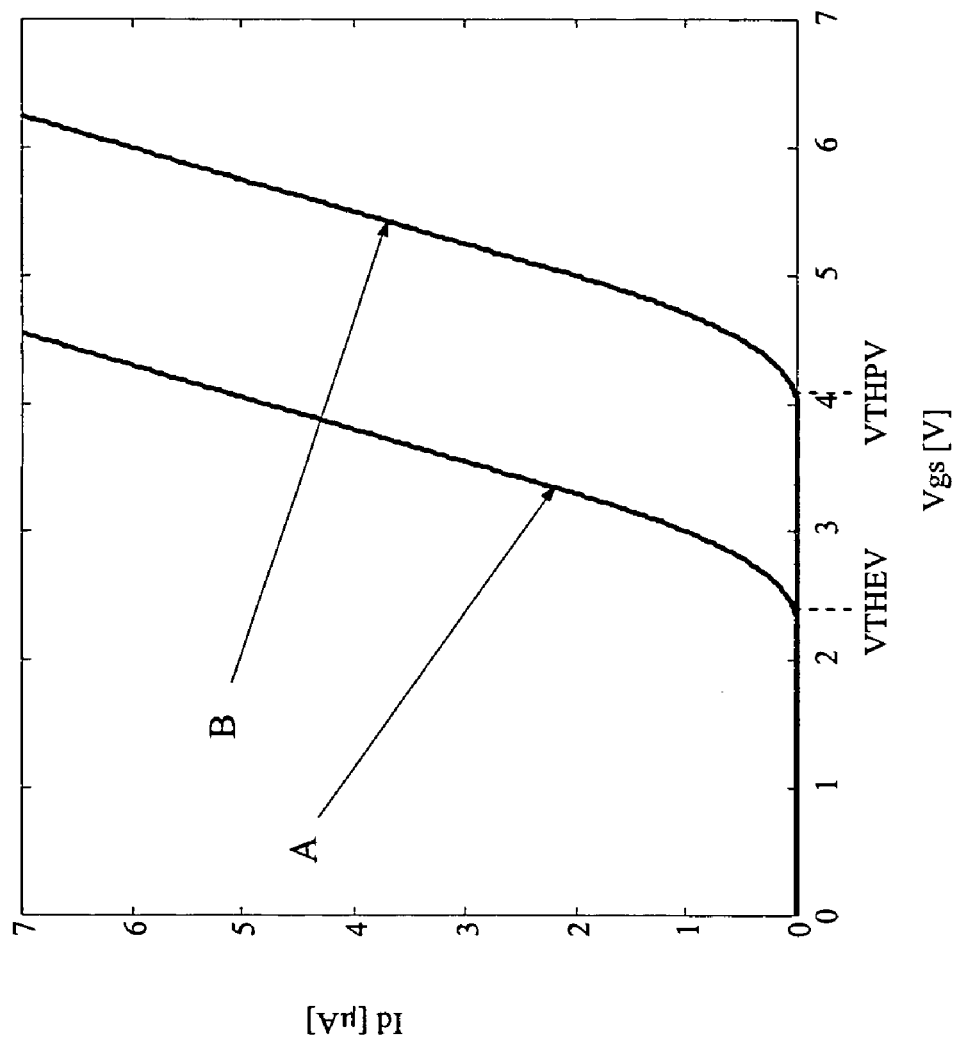
FIG. 1 shows the pattern of the current-voltage [I-V] characteristics of Flash cells in two different states, respectively programmed and erased.
Figure 2:
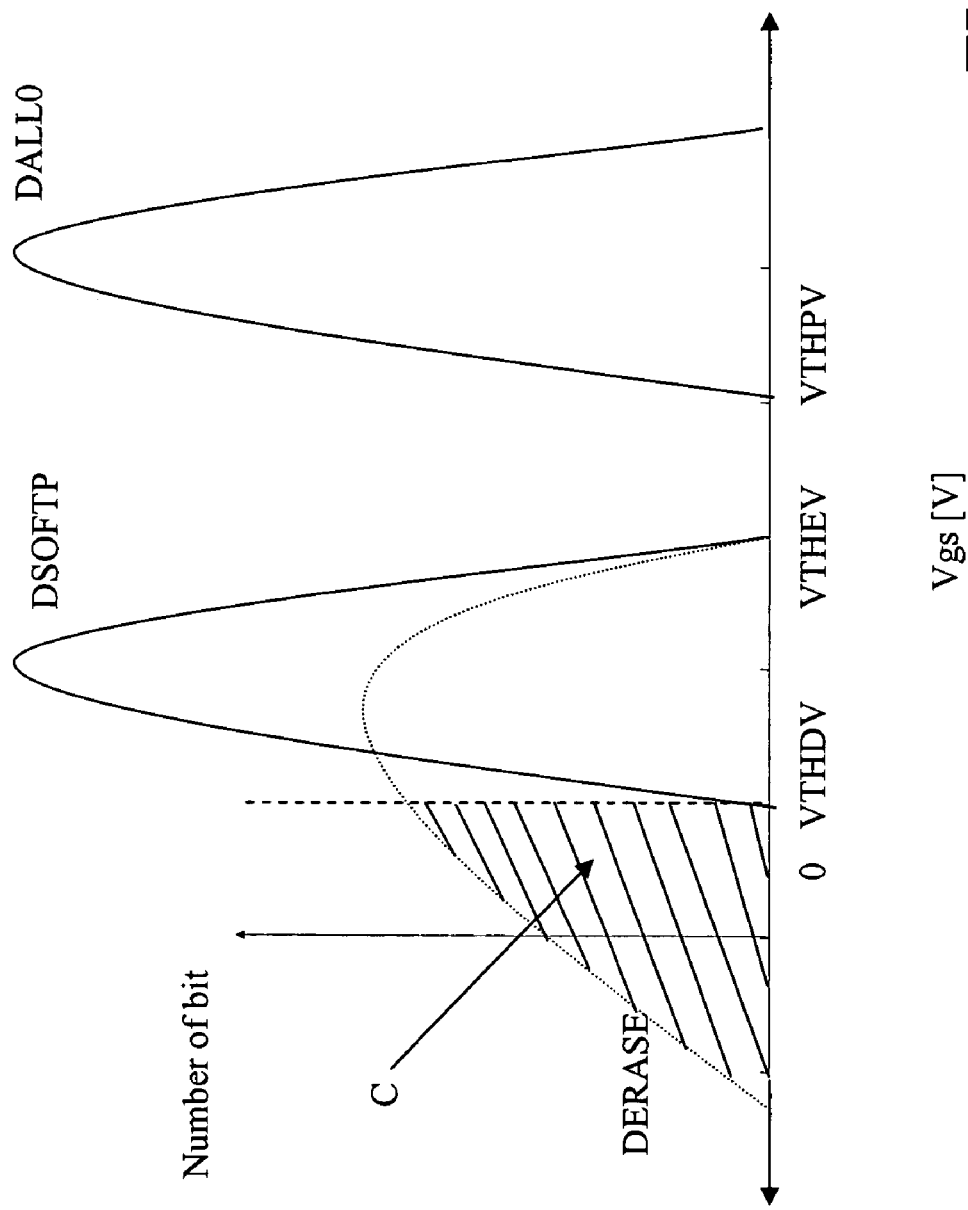
FIG. 2 shows the distribution of the threshold voltages of Flash cells after various steps of an erasing method realized according to the prior art.
Figure 3:
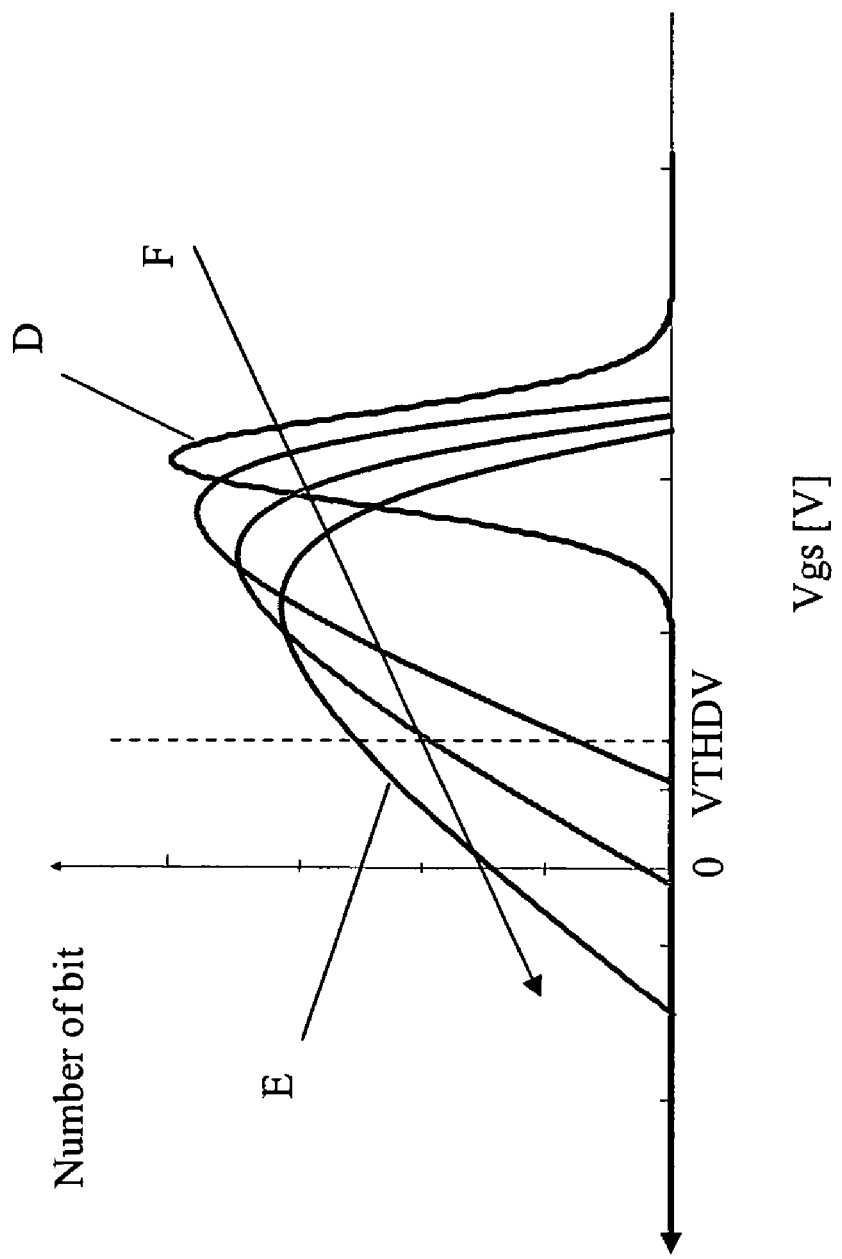
FIG. 3 shows the distribution of the bit threshold voltages after a soft-programming step realized according to the prior art depending on the technological scaling.

Although, as previously said, the population of bits to be soft-programmed after the ERASE step is very consistent, FIG. 6 highlights how the probability that, in each verified page (composed of 4 words), all the bits are to be soft-programmed is close to zero. This condition, in fact, would be represented by a distribution having the maximum coinciding with the value VTHDV, the case being clearly absurd exactly because the ERASE operation is carried out by verifying that the threshold voltage has, as limit, the minimum erase value VTHEV (as previously shown with reference to FIG. 2).

These considerations allow to soft program with a maximum parallelism M in most cases, limiting the programming parallelism np, in particular to the value n linked to the charge pump, in the uncommon cases in which, inside a same page, the number of bits to be soft programmed (bit_to_pr) is greater than the driving capability of the adopted pump.

For these uncommon cases, the programming method proposed adopts a dichotomic approach. In particular, a page which, given the number of bits to be soft-programmed bit_to_pr being higher than the driving capability of the adopted pump, cannot be soft-programmed with maximum parallelism M=64, is programmed in two steps of np1=32 bits each, or in four steps of np2=16 bits, by applying the above indicated rule bit_to_pr<n.

A possible alternative to the dichotomic approach above described, the second parallelism n (identifying the maximum parallelism which can be adopted on the basis of the driving capability of the charge pump) having been chosen, comprises programming a whole page with a number of pulses equal to:

$$bit\_to\_pr/n = IMP, \text{ equal to an integer number of pulses}$$

For example, if after a page verify there were 38 bits to be programmed and if n were 26, the number of pulses to be given would be equal to two, i.e. the managing logic of the above described solution would program the first 26 bits in parallel and the remaining 12 at the successive pulse.

The parameter n, identifying the programming or soft-programming parallelism, has been set during an EWS phase of the Flash memory device and thus, potentially, can vary from lot to lot as from slice to slice. In this case, the architecture 10 also comprises a portion for the loading of this value n in the register 6, not shown in the figure since conventional.

It is also possible to vary, in an embedded way, the parameter n during the life of the device and according to the current absorbed by the Flash cells during the programming and/or soft-programming steps. In this case, the method provides a comparison step of the current absorbed by the Flash cells with that supplied by an inner current reference and a modify step of the parameter n according to the result of this comparison. This allows a greater flexibility as regards the use of the memory device under the various operation conditions.

It is to be noted that it is possible to use the above shown programming method also for the ALL0 step previously described in relation to the prior art.

In fact, the erase operation can occur also on sectors whereon a pattern different from ALL1 has been written, i.e. on a sector which comprises a group of Flash cells which are not all at the value '1', i.e. such that the bits to be pre-programmed in the ALL0 step do not coincide with the totality. In this case, it is possible to realize the pre-programming operation of the ALL0 step with the steps seen for the programming method according to an embodiment of the invention, i.e. with the steps of: verify of a page; counting of the bits to be programmed; choice of the programming parallelism np to be adopted; real programming.

Moreover, it is possible to trace to the same principles also a factory programming operation (like the Double Word Program and Tetra Word Program). In particular, a factory programming operation is usually carried out with the help of a very high external voltage (about 12V).

Advantageously, by using the principles of the programming method according to an embodiment of the invention, it will be possible to carry out the same factory programming operation with a low voltage, having however a small increase of the execution time. This compromise can be desirable in many cases, since the use of programmers managing high voltage is rather onerous in economical terms, and the current trend is that of lowering the rated voltage.

Advantageously, the programming method according to an embodiment of the invention obtains a dynamic parallelism which exploits the driving capability of the used charge pump at the maximum, no matter what the pump is, and, in the meantime, takes into account the maturity attained by the process.

Advantageously according to an embodiment of the invention, in fact, in the case of a possible 40% reduction of the Icell current absorbed by the Flash cell in the soft-programming step, the parallelism of the same soft-programming step increases by the same extent, thus obtaining a great reduction of the erase time of the Flash memory.

On the contrary, the methods proposed by the prior art tend to solve the problem with the theory of the "worst case", wasting resources in the design of a charge pump able to sustain a high parallelism.

In conclusion, the programming method according to an embodiment of the invention, and the corresponding architecture, allow to annul the waste of resources employed in the design of charge pumps able to sustain high parallelisms, waste which still affects the architectures designed according to the prior art. Advantageously, in this way, resources in terms of design time and silicon area are obtained by realizing also an excellent tracking on the process.

Moreover, the programming method according to an embodiment of the invention shows erase times which can be compared with the methods of the prior art which use the "expensive" approach of the "worst case", but at practically null costs.

Although preferred embodiments of the device of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A flash memory comprising:
    a plurality of cells;
    at least one microcontroller to selectively program a first number of said cells at a time or a second number of cells at a time, said first and second numbers being different;
    a counter and a verify block coupled to said counter;
    a combinatorial portion to generate a control flag to select the first or second number of cells;
    a charge pump; and
    a register having a second parallelism corresponding to a driving capability value of the charge pump according to the relation:
    n=Icharge_pump/Icell
    wherein
    Icharge_pump is a maximum value of the current which can be supplied by the charge pump, and
    Icell is a value of the current absorbed by a memory cell during a programming.

2. The memory of claim 1, wherein the counter to supply the combinatorial portion with a number corresponding to a number of memory cells needing to be programmed as verified by the verify block.

3. The memory of claim 1, wherein the combinatorial portion receives at the input and compares the number of cells to be programmed and the second parallelism stored in the register and generates the control flag according to the following relations:
    PR_PAGE=1 if the number of memory cells to be programmed is lower or equal to the second parallelism (bit_to_pr<=n); and
    PR_PAGE=0 if the number of memory cells to be programmed is higher than the second parallelism (bit_to_pr>n).

4. The memory of claim 1, wherein the microcontroller carries out the programming operation according to a programming parallelism determined on the basis of the control flag according to the following rules:
    if PR_PAGE=1, attribution to the programming parallelism of a value corresponding to a value of maximum parallelism (np=M); and
    if PR_PAGE=0 attribution to the programming parallelism of a value corresponding to a value of minimum parallelism (np=n).

5. The memory of claim 4, wherein the value of maximum parallelism corresponds to the first parallelism.

6. The memory of claim 4, wherein the value of minimum parallelism corresponds to the second parallelism.

7. The memory of claim 1, wherein the microcontroller carries out the programming operation according to a programming parallelism determined in a dichotomic way according to the relation:
    if the number of memory cells to be programmed is higher than the second parallelism (bit_to_pr=n), attribution to the programming parallelism of a value corresponding to half of the value of maximum parallelism (np=M/2), this relation being consecutively applied up to exhaustion of the cells to be programmed.

* * * * *

UNITED STATES PATENT AND TRADEMARK OFFICE
CERTIFICATE OF CORRECTION

PATENT NO. : 7,606,078 B2  Page 1 of 1
APPLICATION NO. : 11/636382
DATED : October 20, 2009
INVENTOR(S) : Davide Torrisi, Edoardo Nocita and Alessandro Tumminia It is certified that error appears in the above-identified patent and that said Letters Patent is hereby corrected as shown below:

Column 10:
Line 44, "bit_to_pr=n" should be --bit_to_pr>n--.

Signed and Sealed this

First Day of December, 2009

David J. Kappos
*Director of the United States Patent and Trademark Office*